United States Patent
Ohtsuji

(10) Patent No.: US 10,108,671 B2
(45) Date of Patent: Oct. 23, 2018

(54) INFORMATION PROCESSING DEVICE, COMPUTER-READABLE RECORDING MEDIUM HAVING STORED THEREIN INFORMATION PROCESSING PROGRAM, AND INFORMATION PROCESSING METHOD

(71) Applicant: FUJITSU LIMITED, Kawasaki-shi, Kanagawa (JP)

(72) Inventor: Hiroki Ohtsuji, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/794,035

(22) Filed: Oct. 26, 2017

(65) Prior Publication Data
US 2018/0121516 A1 May 3, 2018

(30) Foreign Application Priority Data
Nov. 2, 2016 (JP) ................................. 2016-214812

(51) Int. Cl.
H03M 7/34 (2006.01)
G06F 17/30 (2006.01)
H03M 7/30 (2006.01)

(52) U.S. Cl.
CPC .. *G06F 17/30501* (2013.01); *G06F 17/30539* (2013.01); *H03M 7/30* (2013.01); *H03M 7/3079* (2013.01); *H03M 7/6064* (2013.01)

(58) Field of Classification Search
CPC .............. H03M 7/6064; H03M 7/3079; G06F 17/30501; G06F 17/30539
USPC ..................................................... 341/51-70
See application file for complete search history.

(56) References Cited

U.S. PATENT DOCUMENTS

| 5,959,733 A * | 9/1999 | Wei .................... G01N 21/86 356/237.1 |
| 6,721,753 B1 * | 4/2004 | Kataoka ................ G06F 3/0608 |
| 9,094,041 B2 * | 7/2015 | Kataoka .................... G06F 5/00 |
| 9,547,588 B1 * | 1/2017 | Biederman .......... G06F 12/0246 |

(Continued)

FOREIGN PATENT DOCUMENTS

| JP | 2011-48679 | 3/2011 |
| JP | 2014-175008 | 9/2014 |
| JP | 2016-524821 | 8/2016 |

OTHER PUBLICATIONS

EMC Corporation, "Introduction to the EMC XtremIO Storage Array (Ver. 4.0) A Detailed Review", Apr. 2015, <URL http://japan.emc.com/collateral/white-papers/h11752-intro-to-XtremIO-array-wp.pdf> with corresponding English publication (130 pages).

*Primary Examiner* — Lam T Mai
(74) *Attorney, Agent, or Firm* — Fujitsu Patent Center

(57) ABSTRACT

An information processing device includes: a memory configured to store data concerning a write access; and a processor coupled to the memory, the processor being configured to: record, for each data, time of a write access of the data to management information, when writing out data from the memory to a storage, determine a plurality of data as a group of overall compression based on the management information, the plurality of data having a difference of time of write accesses being equal to or less than a threshold value, and compress the plurality of data corresponding to the determined group by an overall compression, and write compressed data obtained through the overall compression to the storage.

20 Claims, 15 Drawing Sheets

(56) References Cited

U.S. PATENT DOCUMENTS

| | | | |
|---|---|---|---|
| 9,684,665 B2* | 6/2017 | Ohno | G06F 17/30153 |
| 2001/0043790 A1* | 11/2001 | Saeki | G11B 19/022 |
| | | | 386/241 |
| 2002/0078062 A1* | 6/2002 | Kataoka | G06F 3/0608 |
| 2007/0110014 A1* | 5/2007 | Mizuguchi | H04M 1/7253 |
| | | | 370/338 |
| 2009/0316046 A1* | 12/2009 | Yamazaki | G11B 27/036 |
| | | | 348/468 |
| 2012/0166752 A1* | 6/2012 | Taniyama | G06F 3/0664 |
| | | | 711/170 |
| 2014/0201175 A1* | 7/2014 | Ohno | G06F 17/30153 |
| | | | 707/693 |
| 2014/0258655 A1 | 9/2014 | Park et al. | |
| 2015/0331913 A1 | 11/2015 | Borowiec et al. | |

\* cited by examiner

FIG. 1
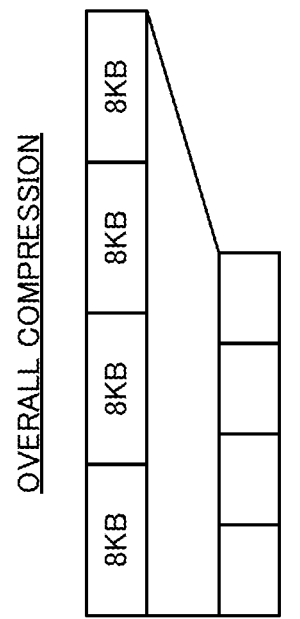
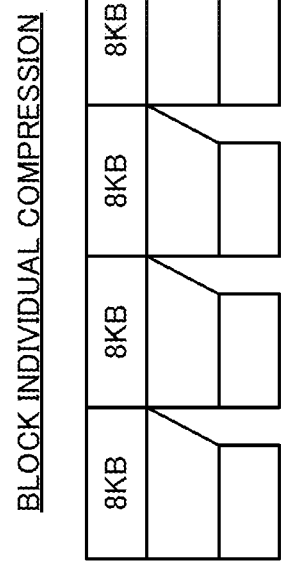

FIG. 6

LOGICAL ADDRESS TABLE
~312

| LOGICAL ADDRESS | PAGE ID |
|---|---|
| 0x0001 | 0 |
| 0x0002 | 0 |
| 0x0003 | 1 |
| 0x0004 | 2 |

FIG. 7

PAGE TABLE ~314

| PAGE ID | HASH VALUE OF BLOCK | NUMBER OF REFERENCE | PHYSICAL ADDRESS | OFFSET IN COMPRESSED DATA | TIMESTAMP [ms] | VOLUME ID |
|---|---|---|---|---|---|---|
| 0 | 0x2345 | 2 | 0xabcd | 0 | 10 | 1 |
| 1 | 0x3456 | 1 | 0xbcde | 0 | 100 | 1 |
| 2 | 0x4567 | 1 | 0xbcde | 1 | 101 | 1 |

FIG. 8

COMPRESSED DATA
DECOMPRESSION INFORMATION

316

| PHYSICAL ADDRESS | READ FLAG |
|---|---|
| 0xbcde | 01001 ... |
| 0x ... | ... |
| 0x ... | ... |

INFORMATION PROCESSING DEVICE, COMPUTER-READABLE RECORDING MEDIUM HAVING STORED THEREIN INFORMATION PROCESSING PROGRAM, AND INFORMATION PROCESSING METHOD

CROSS-REFERENCE TO RELATED APPLICATION

This application is based upon and claims the benefit of priority of the prior Japanese Patent Application No. 2016-214812, filed on Nov. 2, 2016, the entire contents of which are incorporated herein by reference.

FIELD

The present invention relates to an information processing device, a computer-readable recording medium having stored therein an information processing program, and an information processing method.

BACKGROUND

A technology to store data to a storage after compressing the data is known in information processing systems such as storage devices including a storage. With the technology, a data amount stored in the storage can be reduced and use efficiency of the storage can be enhanced.

An example of a data compression algorithm includes a dictionary compression algorithm. The dictionary compression algorithm is a compression algorithm to assign a code to a unique data string that has once appeared, and record the code and a match length for the same data string that appears afterward.

By the way, a storage device, i.e., a block storage, which controls input/output of data to/from a storage in block, is known. In the block storage, the data is compressed in units of input/output (in block), for example.

As described above, the dictionary compression algorithm is performed on the assumption of existence of the data string that appears a plurality of times, in the data to be compressed. Therefore, when compression processing is individually performed for each block, the frequency of appearance of the same data string in the block becomes lower as the size per block becomes smaller, and a high compression ratio may not be expected.

Therefore, technologies to improve the compression ratio by compressing a plurality of blocks by overall compression are known.
Patent Document 1: Japanese National Publication of International Patent Application No. 2016-524821
Patent Document 2: Japanese Laid-open Patent Publication No. 2011-48679
Non-Patent Document 1: EMC Corporation, "INTRODUCTION TO THE EMC XtremIO STORAGE ARRAY (Ver. 4.0) A Detailed Review", White Paper, [online], May 2015, [searched on Oct. 14, 2016], the Internet <URL:// japan.emc.com/collateral/white-papers/h11752-intro-to-XtremIO-array-wp.pdf>

When a read access from a host device to the storage occurs, the storage device which compresses and stores data decompresses and stores a portion from a head to a tail of data to be read out, of compressed data, and responds to the host with the data to be read out obtained through the decompression. The reason to perform decompression processing from the head of the compressed data is because the decompression processing depends on data prior to the processing portion in the compressed data, and thus the decompression processing is not able to be started from a middle of the compressed data.

Therefore, in a case of overall compression of a plurality of blocks, when read-out of a portion (block) other than the head block in the compressed data (hereinafter, the read-out is written as "partial read-out") occurs, the decompression processing may take longer time than that in a case of compression in block.

As described above, it is effective to increase the number of blocks to be compressed by overall compression in order to increase the compression ratio. However, the frequency of occurrence of the partial read-out becomes higher as the number of blocks to be compressed by overall compression is larger, and thus a possibility to decrease read access performance becomes high.

SUMMARY

According to an aspect of the embodiments, an information processing device may include a memory configured to store data concerning a write access, and a processor coupled to the memory. The processor may be configured to record, for each data, time of a write access of the data to management information, when writing out data from the memory to a storage, determine a plurality of data as a group of overall compression based on the management information, the plurality of data having a difference of time of write accesses being equal to or less than a threshold value, and compress the plurality of data corresponding to the determined group by an overall compression, and write compressed data obtained through the overall compression to the storage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram for describing an example of compression ratios of block individual compression and overall compression;

FIG. 6 is a diagram illustrating an example of a logical address table;

FIG. 7 is a diagram illustrating an example of a page table;

FIG. 8 is a diagram illustrating an example of compressed data decompression information;

DESCRIPTION OF EMBODIMENT(S)

Figure 2:
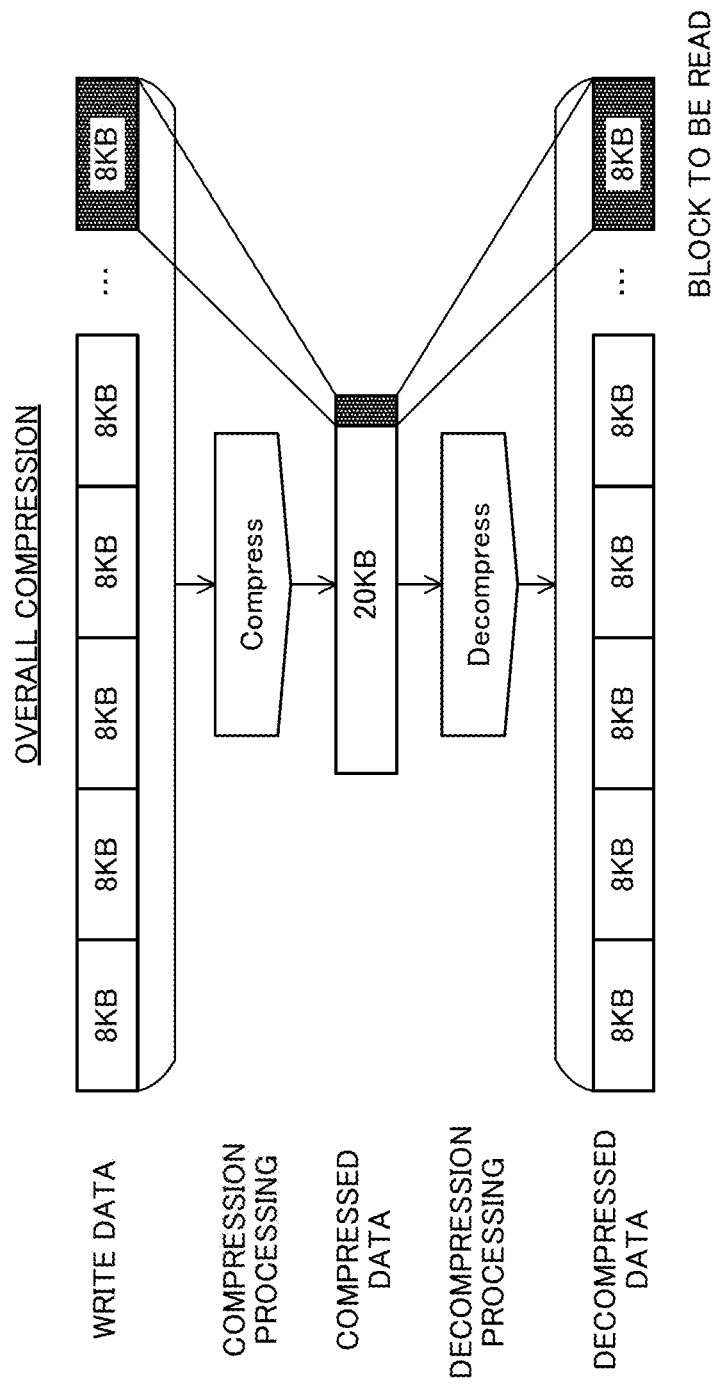
FIG. 2 is a diagram for describing an example of partial read-out from overall compression data.

Hereinafter, embodiments of the present invention will be described with reference to the drawings. Note that the embodiments described below are for illustrative purposes only, and do not intend to exclude application of various modifications and technologies which are not clearly specified below. For example, the present embodiments can be modified and implemented in various manners without departing from the gist of the embodiments. Note that, in the drawings used in the embodiments below, a portion denoted with the same reference sign represents the same portion or a similar portion unless otherwise specified.

[1] Embodiment

[1-1] Data Compression

As described above, a block storage can improve a compression ratio of data to be written to a device such as a storage, by compressing a plurality of blocks by overall compression, rather than individually compressing the data in units of block (for example, 8 KB (byte)) (see FIG. 1).

Meanwhile, as illustrated in FIG. 2, in a case where write data is compressed by overall compression by compression processing, to read out a part of data from compressed data (for example, data of 20 KB, which is compressed data of a plurality of blocks), all the compressed data up to a portion to be read out needs to be decompressed. For example, to read out the last block, decompression processing of the entire compressed data is performed. Note that the data to be read out is picked up after the entire compressed data up to the portion to be read out is decompressed.

Figure 3:
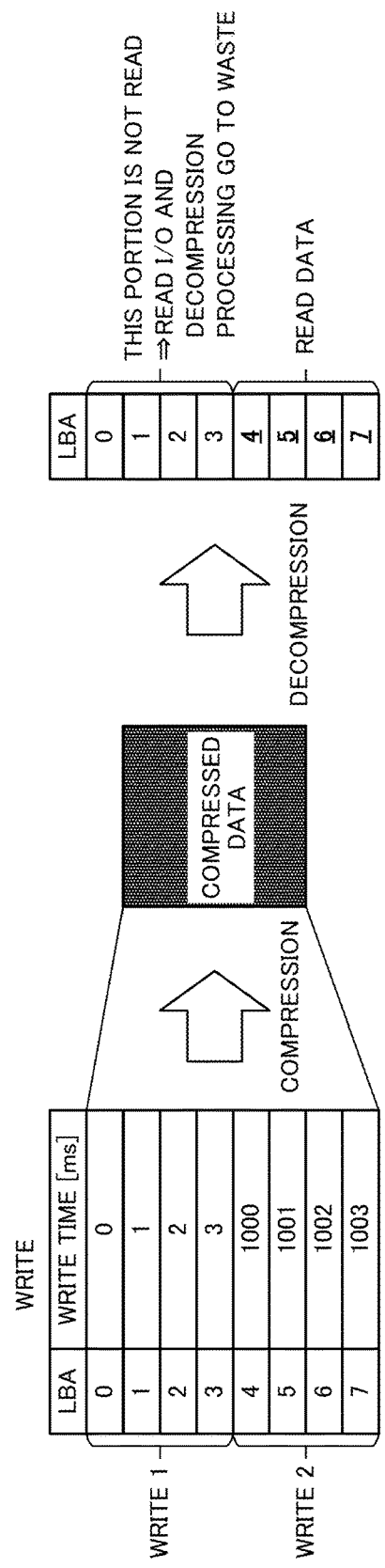
FIG. 3 is a diagram for describing an example of partial read-out from overall compression data.

To be specific, for example, assume a case in which data is written to logical block addresses (LBAs) 0 to 3 (write 1), then, another write occurs in LBAs 4 to 7 after a period of time (write 2), and the data of the LBAs 0 to 7 are compressed by overall compression, as illustrated in FIG. 3.

In this case, when a read-out request (read input/output (I/O)) occurs for the data of the LBAs 4 to 7, the entire compressed data is decompressed, and then the data of the LBAs 4 to 7 are picked up as read data. At this time, the data in the portion of the LBAs 0 to 3 are not read, and thus the read I/O and the decompression processing go waste.

In this way, when a plurality of blocks is compressed by overall compression, the compression ratio may be improved, but access performance of partial read-out for portions (for example, middle and last blocks) other than the head block, of the compressed data, may be affected.

In an embodiment, both improvement of the compression ratio of data and reduction of a decrease in the access performance are achieved by decreasing a possibility of occurrence of partial read-out of compressed data by a technique described below.

[1-2] Configuration Example of Embodiment

Hereinafter, a configuration example of an embodiment will be described with reference to FIGS. 4 to 9.

[1-2-1] Configuration Example of System

Figure 4:
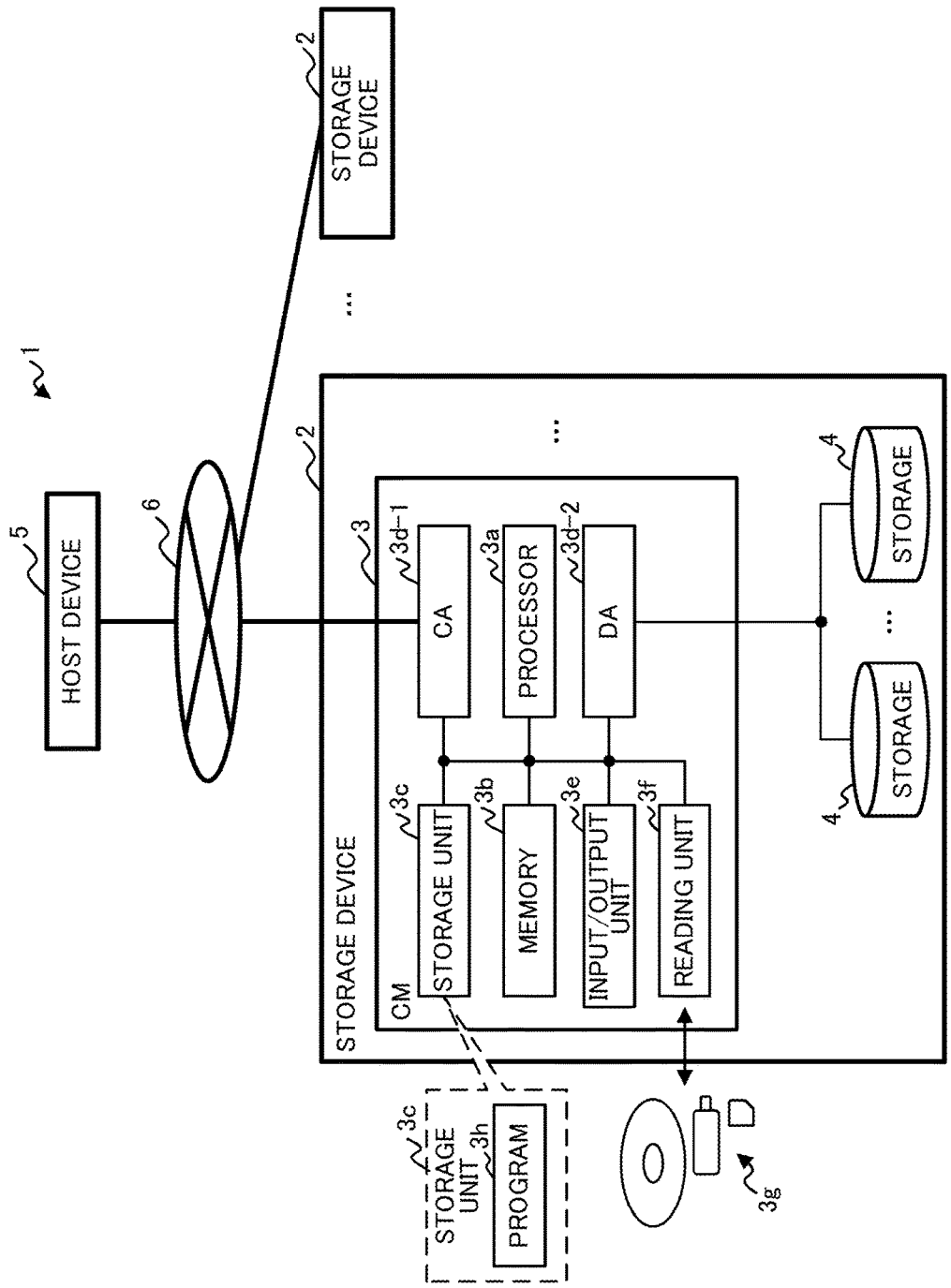
FIG. 4 is a block diagram illustrating a configuration example of a system according to an embodiment.

FIG. 4 is a block diagram illustrating a configuration example of a system 1 according to an embodiment. As illustrated in FIG. 4, the system 1 may illustratively include one or more storage devices 2 (a plurality of storage devices 2 in the example of FIG. 4) and a host device 5.

The storage device 2 is an example of an information processing system. The storage device 2 may illustratively include one or more controller modules (CMs) 3 and one or more storages 4 (a plurality of storages 4 in the example of FIG. 4), and may provide a storage area of the storage 4 to the host device 5. For example, the storage device 2 may store data in the plurality of storages 4 in a distributed or redundant state, using redundant arrays of inexpensive disks (RAID).

The CM3 is an example of an information processing device (computer) or a control device that controls various I/Os for the plurality of storages 4 from the host device 5.

The storage 4 is an example of hardware that stores various data, programs, and the like. Examples of the storage 4 include a semiconductor drive device such as a solid state drive (SSD), a non-volatile memory, and a magnetic disk device such as a hard disk drive (HDD). Examples of the non-volatile memory include a flash memory, a storage class memory (SCM), and a read only memory (ROM).

Note that the storage device 2 may include a controller enclosure (CE) as a control cabinet that stores the CM3 and a drive enclosure (DE) that mounts the storage 4, and a scale-out storage system may be configured from a plurality of the storage devices 2. Note that both the CE and DE may mount the storage 4.

The host device 5 issues various I/Os such as a write request and a read-out request to the one or more storage devices 2 through a network 6. An object to be accessed of the I/Os may be designated by a logical address, for example, an LBA, which is recognized by the host device 5. Note that, in the description below, the "I/O" is an access request including at least the logical address to be accessed and data to be written (in the case of a write access).

Examples of the host device 5 include computers such as a business server, a backbone server, and a client machine. FIG. 4 illustrates one host device 5. However, a plurality of the host devices 5 may exist in the system 1.

The network 6 may include, for example, a storage area network (SAN), and may include network devices such as one or more switches (not illustrated). Further, the network 6 may include the Internet, a local area network (LAN), or a wide area network (WAN). The storage device 2 and the host device 5 are connected with an optical cable or an Ethernet (registered trademark) cable conforming to Fibre Channel (FC) or an internet small computer system interface (iSCSI) through the network 6.

[1-2-2] Hardware Configuration Example of CM

Next, a hardware configuration example of the CM3 will be described with reference to FIG. 4. As illustrated in FIG. 4, the CM3 may illustratively include a processor 3a, a memory 3b, storage unit 3c, a channel adaptor (CA) 3d-1, a device adaptor (DA) 3d-2, an input/output unit 3e, and a reading unit 3f.

The processor 3a is an example of an arithmetic processing device that performs various types of control and arithmetic operations. The processor 3a may be communicatively and mutually connected with the blocks 3b to 3f through a bus. As the processor 3a, an integrated circuit (IC) such as a CPU, an MPU, a DSP, an ASIC, or an FPGA may be used. Note that the CPU is an abbreviation of a central processing unit, the MPU is an abbreviation of a micro processing unit, and the DSP is an abbreviation of a digital signal processor. Further, the ASIC is an abbreviation of application specific integrated circuit, and the FPGA is an abbreviation of a field programmable gate array.

The memory 3b is an example of hardware that stores various data and programs. An example of the memory 3b includes a non-volatile memory such as a random access memory (RAM). Note that a part of a storage area of the memory 3b may be used as a cache memory that temporarily stores data and programs to be used for an access or the like to the storage 4.

The storage unit 3c is an example of hardware that stores various data, programs, and the like. Examples of the storage unit 3c include a magnetic disk device such as an HDD, a semiconductor drive device such as an SSD, and various storages such as a non-volatile memory. The storage unit 3c may store the program 3h that realizes all or a part of various functions of the CM3. The processor 3a can realize the functions of the CM3 by decompressing the program 3h stored in the storage unit 3c to the memory 3b and executes the program 3h.

The CA 3d-1 is an example of a communication interface that performs control of connection and communication with the host device 5. The DA 3d-2 is an example of a communication interface that performs control of connection and communication with the storage 4. Further, the CM3 may include a communication interface that performs control of connection and communication with a workstation of a worker, and may download the program 3h from the network 6 or another network (not illustrated), using the communication interface.

The input/output unit 3e may include at least a part of an input unit such as a mouse, a keyboard, or an operation button, and an output unit such as a display or a printer.

The reading unit 3f is an example of a reader that reads out data and a program recorded on a recording medium 3g. The reading unit 3f may include a connection terminal or a device in which the recording medium 3g is connectable or insertable. Examples of the reading unit 3f include an adaptor conforming to a universal serial bus (USB), a drive device that accesses a recording disk, and a card reader that accesses a flash memory such as an SD card. Note that the program 3h may be stored in the recording medium 3g.

Examples of the recording medium 3g illustratively include non-transitory computer-readable recording media such as magnetic/optical disks and a flash memory. Examples of the magnetic/optical disks illustratively include a flexible disk, a compact disc (CD), a digital versatile disc (DVD), a Blu-ray disc, and a holographic versatile disc (HVD). Examples of the flash memory illustratively include a USB memory and an SD card. Examples of the CD illustratively include a CD-ROM, a CD-R, and a CD-RW. Further, examples of the DVD illustratively include a DVD-ROM, a DVD-RAM, a DVD-R, a DVD-RW, a DVD+R, and a DVD+RW.

The above-described hardware configuration of the CM3 are illustrative. Therefore, increase/decrease (for example, addition or deletion of an arbitrary block), division, integration in an arbitrary combination of hardware, addition or omission of a bus, and the like in the CM3 may be performed as necessary.

[1-2-3] Description of Storage Device

Next, an operation of the storage device 2 according to an embodiment will be briefly described. The storage device 2 according to an embodiment selectively determines a plurality of blocks that becomes an object to be compressed by overall compression in order to decrease the possibility of occurrence of partial read-out of compressed data.

For example, data written in a small time difference (for example, nearly at the same time) tend to have a high possibility to be read out together when they are read-out. Such an example of I/O includes a case of read and write that occur in a series of processing in the host device 5 although read and write are divided at the level of an I/O request from the host device 5 and the LBAs as access destinations are largely different.

Therefore, it can be expected that, even if the data written in a small time difference are collectively compressed, a decrease in the access performance due to the partial read-out is less likely to occur.

For example, the CM3 of the storage device 2 may record, for each data, time of a write access of the data to management information. Further, the CM3 may determine, when writing out data from the memory that stores data concerning a write access to the storage 4, a plurality of data as a group of overall compression based on the management information, the plurality of data having a difference of time of write accesses being equal to or less than a threshold value. Then, the CM3 may compress the plurality of data corresponding to the determined group by overall compression, and write compressed data obtained through the overall compression to the storage 4.

In this way, the CM3 according to an embodiment selectively determines a plurality of blocks for which overall compression is to be performed, using temporal locality of the write accesses described above, thereby to decrease the possibility of occurrence of the partial read-out. With the process, both the improvement of the compression ratio of data and the reduction of a decrease in the access performance can be achieved.

[1-2-4] Functional Configuration Example of CM

Figure 5:
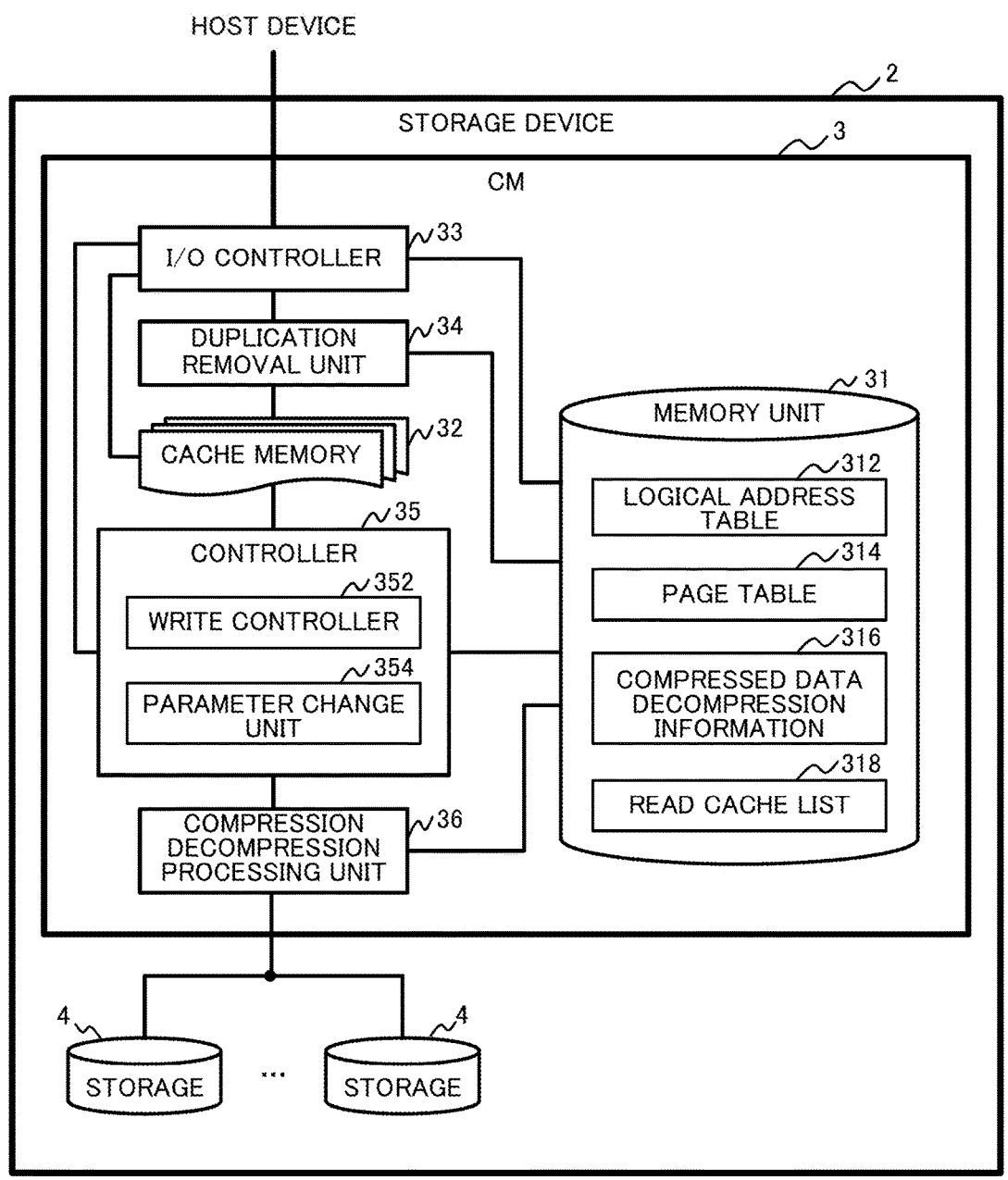
FIG. 5 is a block diagram illustrating a functional configuration example of a storage device illustrated in FIG. 4.

Next, a functional configuration example of the CM3 will be described. As illustrated in FIG. 5, the CM3 may illustratively include a memory unit 31, a cache memory 32, an I/O controller 33, a duplication removal unit 34, a controller 35, and a compression decompression processing unit 36.

The memory unit 31 stores various types of information regarding control of the CM3 and management of I/O. As an example, the memory unit 31 may store a logical address table 312, a page table 314, compressed data decompression information 316, and information of a read cache list 318. The memory unit 31 may be realized, for example, by a part of the storage area of the memory 3b or the storage unit 3c illustrated in FIG. 4.

The logical address table 312 and the page table 314 are examples of information for associating a logical address and a physical address.

FIG. 6 illustrates an example of the logical address table 312. The logical address table 312 is information for associating the logical address and a cache page of the cache memory 32.

The logical address and a page ID (identifier) may be illustratively set to the logical address table 312. The logical address may be, for example, the LBA. The page ID is an ID for identifying a cache page. The size of a block indicated by the logical address and the size of the cache page may be matched, and is 8 KB, for example.

FIG. 7 illustrates an example of the page table 314. The page table 314 is an example of management information for managing, for each cache page, a physical address of the compressed data on the storage 4, and information regarding duplication removal processing and compression processing.

A page ID, a hash value of a block, the number of reference, the physical address, an offset in the compressed data, a timestamp [ms], and a volume ID may be illustratively set to the page table 314. The page ID is an ID corresponding to the page ID of the logical address table 312, and serves as an entry of the page table 314.

The hash value of a block and the number of reference are information regarding the duplication removal processing.

The duplication removal processing is processing for not allowing a plurality of blocks having the same data (hereinafter, the block is written as "the same block") to exist in the storage device 2. A duplication removal (elimination) technology can reduce a data amount and improve capacity efficiency. Therefore, extension of device life of the flash memory, the SSD, and the like can be realized in addition to cost reduction.

In the duplication removal processing, when the same block is written to the storage device 2, the CM3 (for example, the duplication removal unit 34 described below) increments the number of reference of a first written block without recording the second and subsequent blocks to the storage 4. With the processing, a plurality of the logical addresses is associated with one physical address.

In this way, there is a case where the logical address and the physical address do not correspond in a one-to-one manner. Therefore, the page ID is set to the page table 314 instead of the logical address, and the page table 314 can be referred using the page ID of the logical address table 312 as a key. In other words, setting the same page ID to a plurality of logical addresses is permitted in the logical address table 312.

Note that, in judgment of the same block in the duplication removal processing, calculation and comparison of hash values of blocks may be performed. A hash value (fingerprint) is data with a fixed length, which is obtained by performing a predetermined arithmetic operation by a hash function, for an original block.

Referring back to the description of FIG. 7, the hash value obtained through the arithmetic operation in the duplication removal processing may be set to the hash value of a block. As for the number of reference, "1" (initial value) is set to a block in which duplication does not occur, and a value obtained by adding 1 every time duplication elimination is performed is set to a block for which the duplication elimination has been performed. For example, the number of reference "2" of the page ID "0" in FIG. 7 indicates that the duplication elimination has been performed once.

A physical address of compressed data including the block on the storage 4 may be set to the physical address. An offset (position) of the block in the compressed data may be set to the offset in compressed data. As described above, in an embodiment, a plurality of blocks is compressed by overall compression, and thus the offset in compressed data indicates which position in the compressed data the block exists.

Note that the compressed data is single data. Therefore, the same physical address may be set to the plurality of blocks included in the same compressed data, such as the physical address "0xbcde" for the page IDs "1" and "2" in FIG. 7.

The physical address and the offset in compressed data are information registered by the controller 35 and the compression decompression processing unit 36 described below, and thus these pieces of information may be unregistered at the stage where the data is stored in the cache memory 32.

Time when the CM3 accepts a write I/O may be set to the timestamp [ms]. Note that, in the example of FIG. 7, the timestamp is a numerical value that represents temporal relationship (a larger value such as "10", "100", or "101" indicates a newer time), for convenience. However, in reality, information including date and time (for example, up to millisecond) may be set.

When the duplication elimination is performed, the timestamp of an appropriate page ID is not updated. In other words, the time when the write access is first made may be set to the page ID regardless of existence of the duplication elimination.

The volume ID is an example of information for identifying a volume that is an object of I/O. For example, an example of the volume ID includes a logical unit number (LUN) to which a block is written. The timestamp and the volume ID are used for control by the controller 35 described below.

Referring back to the description of FIG. 5, the cache memory 32 temporarily stores data and programs used for an access to the storage 4. As an example, the cache memory 32 may store write data concerning the write I/O, read-out data read out from the storage 4 in response to a read I/O, and the like.

The data stored in the cache memory 32 may be written out to the storage 4 or released from the cache memory 32 at predetermined timing by a cache page substitution algorithm by the CM3. The cache memory 32 may be realized by a part of the storage area of the memory 3b illustrated in FIG. 4, for example.

The I/O controller 33 performs various types of control regarding I/O such as reception and response of I/O to the host device 5.

For example, when accepting the write I/O, the I/O controller 33 acquires the timestamp and passes the acquired timestamp to the duplication removal unit 34 together with the accepted write I/O.

Further, when accepting the read I/O, the I/O controller 33 judges whether data of the logical address to be read out exists in the cache memory 32 by reference to the logical address table 312. In a case of cache hit, the I/O controller 33 reads out the data from the cache memory 32 and responds to the read I/O. On the other hand, in a case of cache miss, the I/O controller 33 passes the accepted read I/O to the controller 35.

The duplication removal unit 34 performs the duplication removal processing for the write I/O accepted by the I/O controller 33.

For example, the duplication removal unit 34 performs arithmetic operation for the hash value of the data to be written, searches the page table 314, using the hash value obtained through the arithmetic operation as a key, and judges existence/non-existence of a cache page having the same hash value as the obtained hash value.

When the cache page having the same hash value as the obtained hash value exists, the existence means existence of the same data as the data to be written in the cache page. Therefore, the duplication removal unit 34 performs duplication removal on the data to be written (does not write the data to the cache memory 32), and increments the number of reference of the cache page having the same hash value. Further, the duplication removal unit 34 adds an entry of a logical address (for example, a LBA) of a write destination to the logical address table 312, and registers a page ID of the cache page having the same hash value to the page ID.

On the other hand, when the cache page having the same hash value as the obtained hash value does not exist, the duplication removal unit 34 adds an entry of a logical address of a write destination to the logical address table 312, and registers a new page ID. Further, the duplication removal unit 34 adds an entry of the page ID registered to the logical address table 312 to the page table 314. For example, the duplication removal unit 34 sets, to the entry of the page table 314, the information such as the hash value obtained through the arithmetic operation, the number of reference "1", the timestamp acquired from the I/O controller 33, and the volume ID to be written.

As described above, the I/O controller 33 and the duplication removal unit 34 are an example of a recording unit that records, for each data, time of a write access of the data to the page table 314.

Further, the duplication removal unit 34 is an example of a suppression unit that performs processing below. This processing is performed when a second write access to write second data that is the same as first data to a second address is accepted, in a state where time of a first write access to write first data to a first address is recorded to the page table 314. In this case, the duplication removal unit 34 as the suppression unit associates the second address with the first data, and suppresses storage of the second data to the cache memory 32.

The controller 35 performs various types of control such as write-out (may be referred to as "write-back") of data from the cache memory 32 to the storage 4, read-out of data from the storage 4 to the cache memory 32, and update of information to be stored in the memory unit 31. The controller 35 may illustratively include a write controller 352 and a parameter change unit 354.

The write controller 352 performs control regarding a group of overall compression. The control by the write controller 352, for example may be performed in write-out of data from the cache memory 32 to the storage 4.

For example, the write controller 352 sequentially selects a block to be written out, and calculates a difference between the timestamp of the write I/O of the selected block and the timestamp of a previous write I/O, by reference to the page table 314. When the calculated difference is equal to or less than a threshold value (T), the write controller 352 then includes the selected block to a group of overall compression to which a block concerning the previous I/O belongs (hereinafter, the group may be written as "compression group").

The threshold value (T) [second] is a timestamp difference determination threshold value used for determination as to whether a block is to be grouped. An initial value of the threshold value (T) may be about five times a measured value (C) [second] (may be a value measured in advance) of an access interval of when consecutive write is performed to the storage device 2. The threshold value (T) may be dynamically changed by the parameter change unit 354.

Note that the entry is created in order of write to the page table 314. Therefore, the write controller 352 may calculate the difference by comparing the timestamp of the selected block and the timestamp of one upper entry (cache page).

Further, the write controller 352 may consider at least one of conditions (a) to (c) below for judgment of a group. In the description below, the write controller 352 judges that the selected block is to be added to the compression group of a previously written block, when all the conditions (a) to (c) are satisfied in addition to the judgment of the timestamp difference.

(a) No Duplication Elimination has been performed (the Number of Reference is "1").

The write controller 352 may exclude data (block) for which the duplication removal has been performed, from an object of overall compression. Not including the data for which the duplication removal has been performed to the group of overall compression can decrease the possibility of occurrence of the partial read-out of the compression group at different timing from the series of read-out to the compression group.

Therefore, the write controller 352 may judge that the condition (a) is satisfied (the selected block is to be added to the group of overall compression), when the number of reference of the selected block is "1", that is, the selected block is not the object for the duplication elimination, by reference to the page table 314. On the other hand, the write controller 352 excludes the block for which the duplication elimination has been performed, from a candidate of data to be included in the group of overall compression.

(b) The Same Volume ID

When a plurality of write I/Os occurring from the host device 5 at close timing is I/Os written from the same volume, these write I/Os has a high possibility of being a series of write accesses. On the other hand, when a plurality of I/Os occurs at close timing but the write I/Os are written from different volumes, these write I/Os can be considered to be write accesses that are not related to one other although issuance time is close.

Therefore, the write controller 352 may judge that the condition (b) is satisfied, when the volume ID of the selected block and the volume ID of the previously written block are matched, by reference to the page table 314. In other words, the write controller 352 considers a plurality of blocks belonging to the same volume as candidates of data to be included in the group of overall compression.

(c) The Number of Blocks in the Group has not Yet Reached a Grouping Number (N)

To increase the compression ratio of data, it is effective to include a large number of blocks to the compression group. However, the possibility of occurrence of the partial read-out becomes higher as the number of blocks in the compression group is larger.

Therefore, the grouping number (N) as an upper limit of the number of blocks to be included in the group of overall compression is dynamically changed and an optimum upper limit of the grouping number is set by the parameter change unit 354 described below. Note that examples of an initial value of the grouping number (N) includes a numerical value "8" although the initial value is different depending of the block size and use form of the storage device 2.

The write controller 352 may judge that the condition (c) is satisfied, when the number of blocks in the compression group has not yet reached the grouping number (N).

The write controller 352 sequentially selects all the blocks to be written out and performs the above judgment, and adds the block to the compression group until the selected block is judged to be a different group from the previously written block.

Note that the block judged not to belong to the same groups as both the previously written block and a subsequently written block (for example, the block for which the duplication elimination has been performed) is switched to a group of individual compression and is compressed as a single block.

When the belonging group is judged by the write controller 352, one or more blocks in the judged group are compressed by the compression decompression processing unit 36, and the compressed data is written to the storage 4.

As described above, the write controller 352 is an example of a determination unit that determines, when writing out data from the cache memory 32 to the storage 4, a plurality of data as a group of overall compression based on the page table 314, the plurality of data having a difference of time of write accesses being equal to or less than a threshold value.

Note that the write controller 352 or the compression decompression processing unit 36 may set the offset in compressed data and the physical address, when determining the compression group for the page table 314, or when writing the compressed data to the storage 4.

The parameter change unit 354 changes parameters such as the threshold value (T) and the grouping number (N) according to a state of the read access to the compressed data. The processing by the parameter change unit 354 may include at least one of processing (i) to (iii) below.

(i) Change Processing (Decrease Control) of the Threshold Value (T)

The parameter change unit 354 performs processing below, when a read-out access occurs to data in an area other than a head, of the compressed data stored in the storage 4, in other words, when the partial read-out occurs, at a read access.

For example, the parameter change unit 354 calculates a difference ($\Delta t$) between the timestamp of a block for which the read access has occurred and the timestamp of a previous block, in the compression group, by reference to the page table 314. When the calculated $\Delta t$ is longer than the request interval (C) (the above-described measured value) that occurs in consecutive accesses to the storage device 2, the parameter change unit 354 decreases the threshold value (T) to approximate $\Delta t$, or sets the value $\Delta t$ to the threshold value (T).

One of reasons of occurrence of the partial read-out from the compressed data is that the threshold value (T) is large, which is a judgment condition of when adding a plurality of blocks to the compression group. Therefore, the parameter change unit 354 causes the threshold value (T) to approximate $\Delta t$ within a range where the threshold value (T) becomes not equal to or less than the request interval (C) that occurs in consecutive accesses, thereby to adjust the threshold value (T) to a smaller (limited) value.

(ii) Change Processing (Increase Control) of the Threshold Value (T)

The parameter change unit 354 performs processing below, when a read-out access occurs to compressed data obtained through compression of single data and stored in the storage 4, in a read access (when decompressing individually compressed data).

For example, the parameter change unit 354 calculates a difference ($\Delta t$) between the timestamp of the individually compressed block and the write timestamp of a previously read block, by reference to the page table 314. When the $\Delta t$ is smaller than a judgment value (L), the parameter change unit 354 increases the threshold value (T) to approximate the $\Delta t$, or sets the value of $\Delta t$ to the threshold value (T). Note that the judgment value (L) is sufficient elapsed time when two write accesses are considered to be mutually unrelated accesses and is time such as "one second", for example.

When the $\Delta t$ is smaller than the judgment value (L), the individually compressed block and the previously written block are not necessarily said to be the data by mutually unrelated accesses. In other words, there is a possibility that these data blocks are data by a series of write accesses although a timestamp difference is larger than the threshold value (T). Therefore, the parameter change unit 354 causes the threshold value (T) to approximate $\Delta t$ within a range where the threshold value (T) becomes not equal to or more than the judgment value (L), thereby to adjust the threshold value (T) to a larger value.

(iii) Change Processing of the Grouping Number (N)

The parameter change unit 354 performs processing below, when decompressed compressed data is evicted from the read cache (cache memory 32), or after elapse of a fixed time from decompression to the read cache.

For example, the parameter change unit 354 calculates a ratio of an area (for example, a block) that has been actually read-accessed, to the entire area (for example, all the blocks belonging to the compression group), of the decompressed compressed data. The parameter change unit 354 then changes the value (N) as the upper limit of the grouping number, when the calculated ratio does not fall within a predetermined range (for example, a range from ($U_L$) to ($U_H$)).

As an example, the parameter change unit 354 may decrease the grouping number (N) when the calculated ratio is smaller than ($U_L$). Note that a lower limit ($N_{min}$) of the grouping number (N) may be set. Further, the parameter change unit 354 may increase the grouping number (N) when the calculated ratio is larger than ($U_H$). Note that an upper limit ($N_{max}$) of the grouping number (N) may be set.

Note that ($U_L$) is a determination reference (first reference value) of utilization rate after read of the compressed data and is a value such as "20%", for example. ($U_H$) is a determination reference (second reference value) of the utilization rate after read of the compressed data read and is a value such as "80%", for example. ($N_{min}$) is a minimum value that can be taken by (N) and is an integer from 1 to ($N_{max}$) (exclusive of ($N_{max}$)). An example of ($N_{min}$) includes a value "2". ($N_{max}$) is a maximum value that can be taken by N and is an integer larger than ($N_{min}$). An example of ($N_{max}$) includes a value "32".

The parameter change unit 354 may use the compressed data decompression information 316 and the read cache list 318 to calculate the utilization rate concerning the decompressed compressed data.

FIG. 8 illustrates an example of the compressed data decompression information 316. The compressed data decompression information 316 is information that manages, for each compressed data, read states of entries (for example, blocks) in the compression group. A physical address and a read flag may be illustratively set to the compressed data decompression information 316.

The physical address is an example of information for identifying compressed data. Note that any information other than the physical address may be used as long as the information can identify the compressed data. The read flag is a variable-length flag according to the number of entries in the compression group and is one-bit information that indicates existence/non-existence of a read access to one entry (block).

Figure 9:
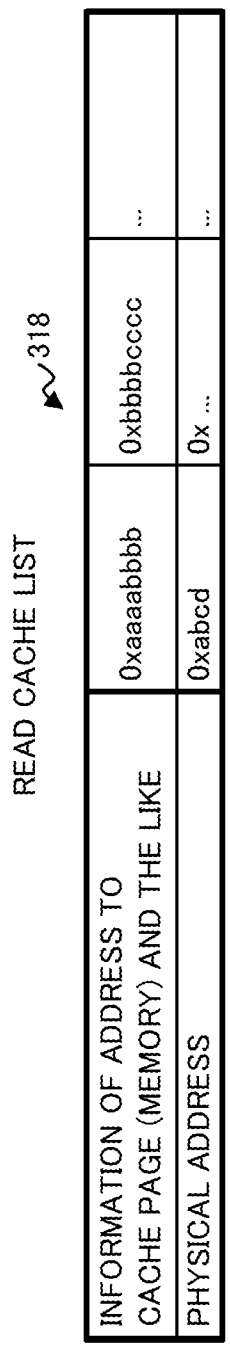
FIG. 9 is a diagram illustrating an example of a read cache list.

FIG. 9 illustrates an example of the read cache list 318. The read cache list 318 is information in which information such as an address of a cache page in the cache memory 32 and the compressed data stored in the cache page are associated with each other.

The read cache list 318 may be information obtained by adding a value that can identify the compressed data to a list of least recently used (LRU), which is used for cache management, for example. Therefore, the address of the cache page and the physical address of the compressed data read in the cache page (physical address where the compressed data is stored) in the read cache list 318 may be updated by cache control of the controller 35.

For example, the parameter change unit 354 identifies the physical address of the compressed data (decompressed data) decompressed in the cache memory 32 according to the read I/O by the controller 35 and the compression decompression processing unit 36, by reference to the read cache list 318. Then, the parameter change unit 354 searches the compressed data decompression information 316, using the identified physical address as a key, and sets "1" to the bit corresponding to the block to be read, of the read flag of the compression group. Note that the bit of the read flag can be identified on the basis of the offset in compressed data set to the page table 314, for example.

Note that, when no entry of an appropriate physical address exists in the compressed data decompression information 316, the parameter change unit 354 may create the entry of the physical address and add a read flag of a bit string of the same number of bits as the number of blocks in the compression group. The read flat added at this time is a bit string in which "1" is set to the bit corresponding to the block to be read and "0" is set to the other bits.

The parameter change unit 354 can calculate the utilization rate concerning the decompressed compressed data by calculating a ratio of the number of bits to which "1" is set to the number of all bits, in relation to the read flag corresponding to the compressed data in the compressed data decompression information 316.

Note that, in the above processing (i) to (iii), the parameter change unit 354 may perform addition or subtraction of a constant or the like, or multiplication or division of a constant or the like, for the threshold value (T) and the grouping number (N) when decreasing or increasing the threshold value (T) and the grouping number (N).

As described above, the parameter change unit 354 is an example of a threshold value change unit that performs control to change the threshold value (T) on the basis of the read-out access to the compressed data stored in the storage 4.

Further, the parameter change unit 354 is an example of an upper limit change unit that manages the state of the read-out access to the decompressed compressed data, and changes the upper limit (N) on the basis of the state of the read-out access, when the decompressed compressed data is released from the cache memory 32.

Referring back to the description of FIG. 5, the compression decompression processing unit 36 performs data compression processing for at least one block read out from the cache memory 32 and writes the compressed data to the storage 4, under control of the controller 35. For example, the compression decompression processing unit 36 may recognize the object block of the data compression processing by being notified, from the write controller 352, information of the overall compression group, for example, information (the page ID as an example) of the cache page of the plurality of blocks belonging to the overall compression group.

Further, the compression decompression processing unit 36 performs data decompression processing for the compressed data read out from the storage 4 and stores at least one decompressed block to the cache memory 32, under control of the controller 35.

Note that the data compression processing is similar in processing itself to compression by zip or the like. A compression algorithm of the data compression processing is not especially limited. In an embodiment, the processing is performed on the assumption of use of a dictionary compression algorithm such as LZ77, LZSS, or LZ4. The data decompression processing may be implemented by an algorithm corresponding to data compression processing.

As described above, the compression decompression processing unit 36 is an example of a compression processing unit that compresses a plurality of data corresponding to the group determined by the write controller 352 by overall compression and writes the compressed data obtained through the overall compression to the storage 4.

Further, the compression decompression processing unit 36 is an example of a decompression processing unit that decompresses the compressed data read out from the storage 4 to the cache memory 32.

According to the above-described storage device 2, a plurality of block is compressed by overall compression, and thus a data string, which appears a plurality of times, can be detected over blocks in compression processing. Therefore, the compression ratio can be improved. Especially, in the block storage, the block size is relatively small, such as 4 KB or 8 KB, and thus the overall compression of the plurality of blocks is more effective for improvement of the compression ratio than a case where the blocks are individually compressed.

Further, blocks written at close timing, that is, blocks having a high possibility of occurrence of accesses at the same time are grouped by the storage device 2. Therefore, a state where the partial read-out is less likely to occur can be created, and a decrease in the access performance can be reduced.

Further, when the partial read-out occurs, adjustment of the threshold value (T) is performed by the storage device 2. Therefore, appropriate grouping according to an access characteristic can be performed for the write access occurring afterward.

Further, the upper limit number (N) to perform grouping can be dynamically changed by the storage device 2 according to the read state of the compressed data. Therefore, a decrease in the access performance can be prevented or reduced.

Further, when data compressed by overall compression is decompressed to the read cache, in addition to the read object of this time, data having a possibility of occurrence of read in the future (for example, blocks different from the read object of this time) are collectively decompressed by the storage device 2. Therefore, a similar effect to prefetch (lookahead) can be exhibited.

Further, a block referred from a plurality of logical addresses, that is, a block for which the duplication elimination has been performed is not grouped with other blocks by the storage device 2.

For example, consider a case in which a block for which the duplication elimination has been performed referred from first and second logical addresses is compressed by overall compression with a block written at the same time with the write access by the first logical address. In this case, the compressed data has a high possibility of being read out from the head of data together with other blocks in the read I/O to the first logical address. Meanwhile, the block for which the duplication elimination has been performed has a high possibility of being partially read out alone in the read I/O to the second logical address.

Therefore, the block for which the duplication elimination has been performed is prevented from being grouped with other block, whereby a decrease in the access performance can be prevented or reduced.

[1-3] Operation Example

Next, an operation example of the storage device 2 configured as described above will be described with reference to FIGS. 10 15.

[1-3-1] Write I/O Processing

Figure 10:
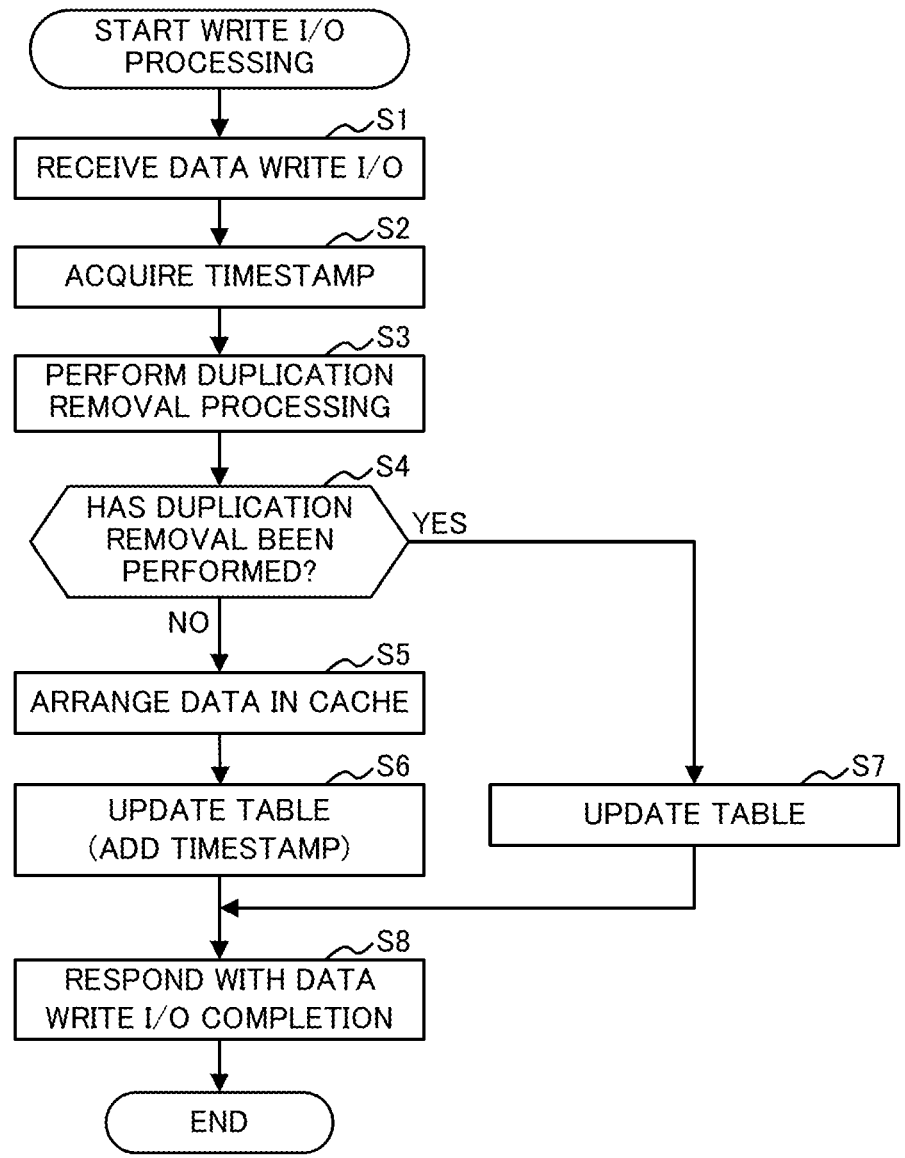
FIG. 10 is a flowchart illustrating an example of write input/output (I/O) processing.

First, an operation example of when the storage device 2 receives a write I/O of data from the host device 5 will be described with reference to FIG. 10.

When receiving the write I/O (step S1), the I/O controller 33 acquires the timestamp (step S2), and passes the write I/O and the timestamp to the duplication removal unit 34.

The duplication removal unit 34 performs the duplication removal processing on the basis of the write I/O (step S3). For example, the duplication removal unit 34 performs arithmetic operation for the hash value of write data included in the write I/O, compares the operated hash value with the hash value registered in the page table 314, and judges whether a cache page having the hash value matched with the write data exists.

When the duplication removal is not performed (No in step S4), that is, when no cache page having the hash value matched with the write data exists, the duplication removal unit 34 arranges the data to the cache memory 32 (step S5).

Further, the duplication removal unit 34 adds entries to the logical address table 312 and the page table 314 to update the tables 312 and 314 (step S6). At this time, the duplication removal unit 34 adds the timestamp notified from the I/O controller 33 to the entry of the page table 314.

Meanwhile, when the duplication removal has been performed in step S3 (Yes in step S4), that is, when the cache page having the hash value matched with the write data exists, the duplication removal unit 34 updates the tables 312 and 314 (step S8). At this time, the duplication removal unit 34 adds the entry to the logical address table 312, and increments the number of reference of the appropriate cache page in the page table 314.

When the tables 312 and 314 are updated in step S6 or S7, the I/O controller 33 transmits, to the host device 5, a completion response to the write I/O of data (step S8), and the processing is terminated.

[1-3-2] Data Write-Out Processing

Figure 11:
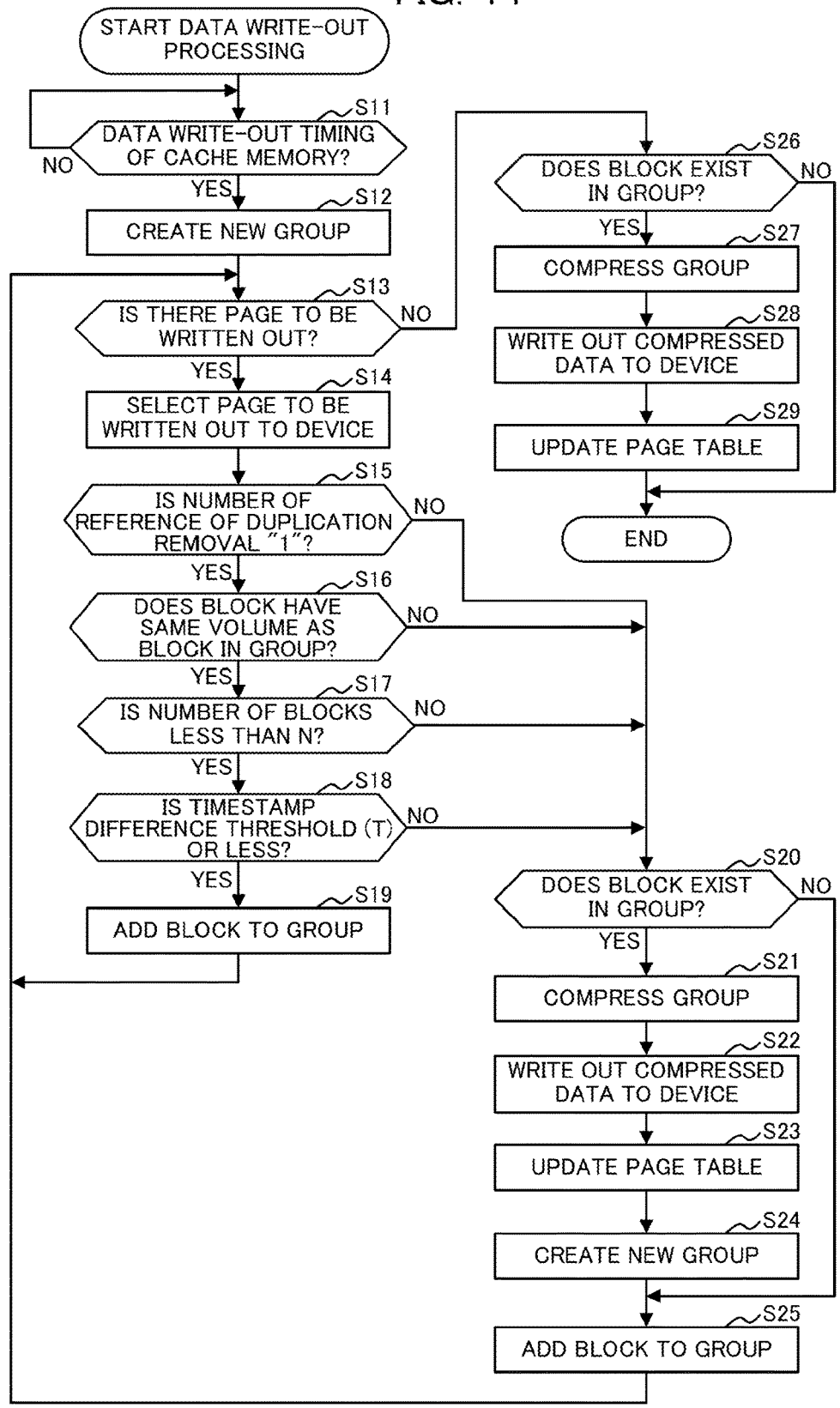
FIG. 11 is a flowchart illustrating an example of data write-out ("write-out" may be referred to as "write-back") processing.

Next, an operation example of data write-out processing from the cache memory 32 to a device (for example, the storage 4) will be described with reference to FIG. 11.

The write controller 352 of the controller 35 waits for data write-out timing of the cache memory 32 according to the cache page substitution algorithm (No in step S11). When the data write-out timing has come (Yes in step S11), the write controller 352 creates a new group (step S12).

The write controller 352 judges whether a page to be written out to the device exists in the cache memory 32 (step S13). When the page to be written out exists (Yes in step S13), the write controller 352 selects one page to be written out to the device (step S14).

The write controller 352 then performs judgment of steps S15 to S18 below by reference to the page table 314. Note that judgment of at least one of steps S15 to S17 may be omitted.

The write controller 352 judges whether the number of reference concerning the duplication removal of the selected page is "1" (step S15). When the number of reference is "1" (Yes in step S15), the write controller 352 judges whether the block in the selected page has the same volume as the blocks in the group (step S16).

When the volume is the same as that of the blocks in the group (Yes in step S16), the write controller 352 judges whether the number of blocks in the group is less than the grouping number (N) (step S17).

When the number of blocks in the group is less than the grouping number (N) (Yes in step S17), the write controller 352 calculates the difference between the timestamp of the block of the selected page and the timestamp of a previously written block. The write controller 352 then judges whether the timestamp difference is equal to or less than the threshold value (T) (step S18).

When the timestamp difference is equal to or less than the threshold value (T) (Yes in step S18), the write controller 352 adds the block of the selected page to the group (step S19), and the processing is moved to step S13.

On the other hand, when No in any of steps S15 to S18, the write controller 352 judges whether blocks exist in the group (step S20).

When the blocks exist in the group (Yes in step S20), the write controller 352 instructs the compression decompression processing unit 36 to compress the group. The compression decompression processing unit 36 compresses the instructed group (step S21), and writes out the compressed data to the device (step S22). Note that the write controller 352 or the compression decompression processing unit 36 may update the page table 314 by registering the physical address in which the compressed data is written and offset information of the blocks in the compressed data (step S23).

The compression group compressed in step S21 includes the block written immediately before (or prior to that) the block of the selected page but does not include the block of the selected page. Therefore, the write controller 352 creates a new group (step S24) and adds the block of the page selected in step S14 to the group (step S25), and the processing is moved to step S13.

Meanwhile, when no blocks exist in the group in step S20 (No in step S20), the write controller 352 adds the block of the page selected in step S14 to the existing group (step S25), and the processing is moved to step S13.

Further, when no page to be written out exists in step S13 (No in step S13), the write controller 352 judges whether the block exists in the group (step S26).

When the blocks exist in the group (Yes in step S26), the write controller 352 instructs the compression decompression processing unit 36 to compress the group. The compression decompression processing unit 36 compresses the instructed group (step S27), and writes out the compressed data to the device (step S28). Further, the write controller 352 or the compression decompression processing unit 36 registers the physical address in which the compressed data is written and offset information of the blocks in the compressed data to update the page table 314 (step S29), and the processing is terminated.

Meanwhile, when no block exists in the group in step S26 (No in step S26), the processing is terminated.

[1-3-3] Threshold Value Change Processing (Decrease Control)

Next, an operation example of change processing (decrease control) of the timestamp difference determination threshold value (T) will be described with reference to FIG. 12.

When the partial read-out of the compressed data from the storage 4 occurs (step S31), the parameter change unit 354 of the controller 35 performs processing below. Note that the controller 35, which is notified with the read I/O from the I/O controller 33, may determine that the read I/O is the partial read-out by reference to the page table 314, when the offset in compressed data of the block to be read out is other than "0".

The parameter change unit 354 calculates the timestamp difference between the block to be partially read out and a previously written block in the same compressed data by reference to the page table 314 (step S32). The parameter change unit 354 then judges whether the timestamp difference is larger than the request interval (measured value) (C) (step S33).

When the timestamp difference is larger than the request interval (C) (Yes in step S33), the parameter change unit 354 decreases the threshold value (T) (step S34), and the processing is terminated. On the other hand, when the timestamp difference is not larger than the request interval (C) (No in step S33), the threshold value (T) is not changed (step S35), and the processing is terminated.

Figure 12:
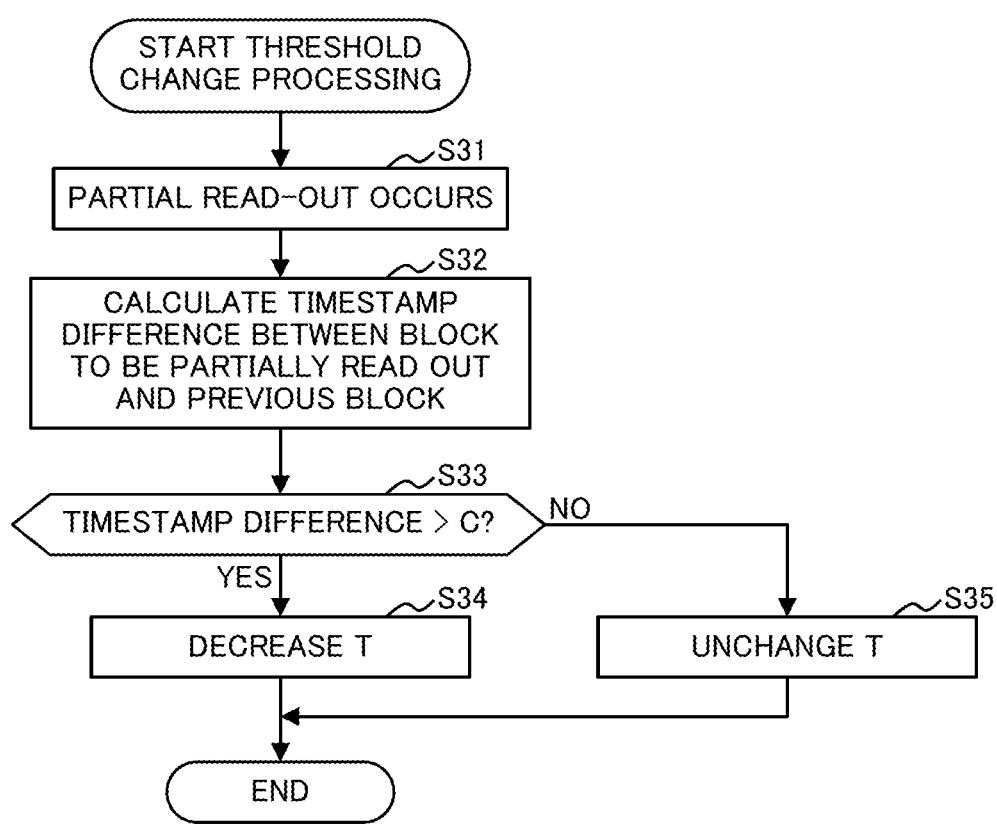
FIG. 12 is a flowchart for describing an example of threshold value change processing.

Note that, in the example of FIG. 12, the processing of the partial read-out from the storage 4 by the controller 35 and the compression decompression processing unit 36 may be performed before or after, or in parallel to the processing of steps S32 to S35.

[1-3-4] Threshold Change Processing (Increase Control)

Next, an operation example of change processing (increase control) of the timestamp difference determination threshold value (T) will be described with reference to FIG. 13.

When read-out of an individual block from the storage 4 occurs (step S41), the parameter change unit 354 performs processing below. Note that the controller 35, which is notified with the read I/O from the I/O controller 33, may determine that the read I/O is read-out of an individual block, by reference to the page table 314, when the physical address of the block to be read out is different from these of both the previously and subsequently written blocks.

The parameter change unit 354 calculates the timestamp difference between the block to be read out and the previously written block, by reference to the page table 314 (step S42). The parameter change unit 354 then judges whether the timestamp difference is smaller than the judgment value (L) (step S43).

When the timestamp difference is smaller than the judgment value (L) (Yes in step S43), the parameter change unit 354 increase the threshold value (T) (step S44), and the processing is terminated. Meanwhile, when the timestamp difference is not smaller than the judgment value (L) (No in step S43), the threshold value (T) is not changed (step S45), and the processing is terminated.

Figure 13:
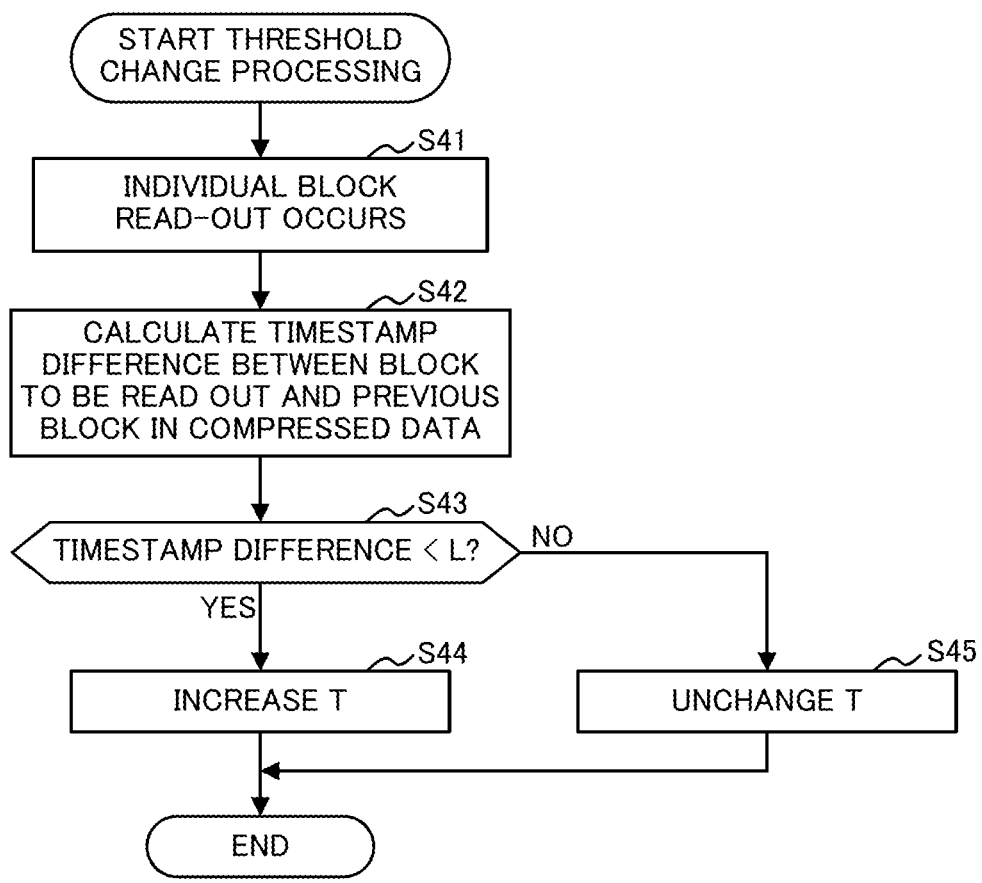
FIG. 13 is a flowchart for describing an example of threshold value change processing.

Note that, in the example of FIG. 13, the processing of read-out of an individual block from the storage 4 by the controller 35 and the compression decompression processing unit 36 may be performed before or after, or in parallel to the processing of steps S42 to S45.

[1-3-5] Read Flag Update Processing

Figure 14:
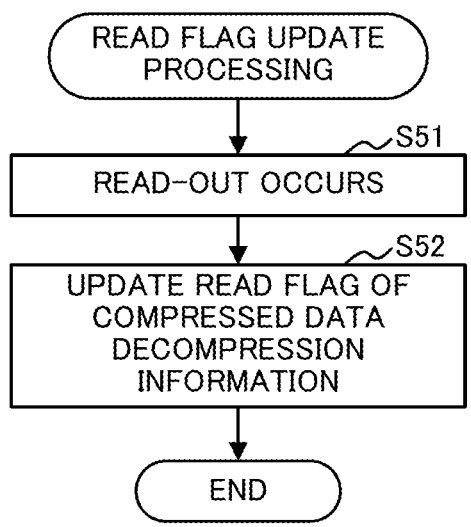
FIG. 14 is a flowchart for describing an example of read flag update processing.

Next, an operation example of read flag update processing will be described with reference to FIG. 14.

When read-out of the compressed data from the storage 4 occurs (step S51), the parameter change unit 354 updates the read flag in the compressed data decompression information 316 (step S52), and the processing is terminated. For example, the parameter change unit 354 sets "1" to the bit corresponding to the block to be read, for the read flag of an appropriate compression group in the compressed data decompression information 316.

[1-3-6] Grouping Number Change Processing

Figure 15:
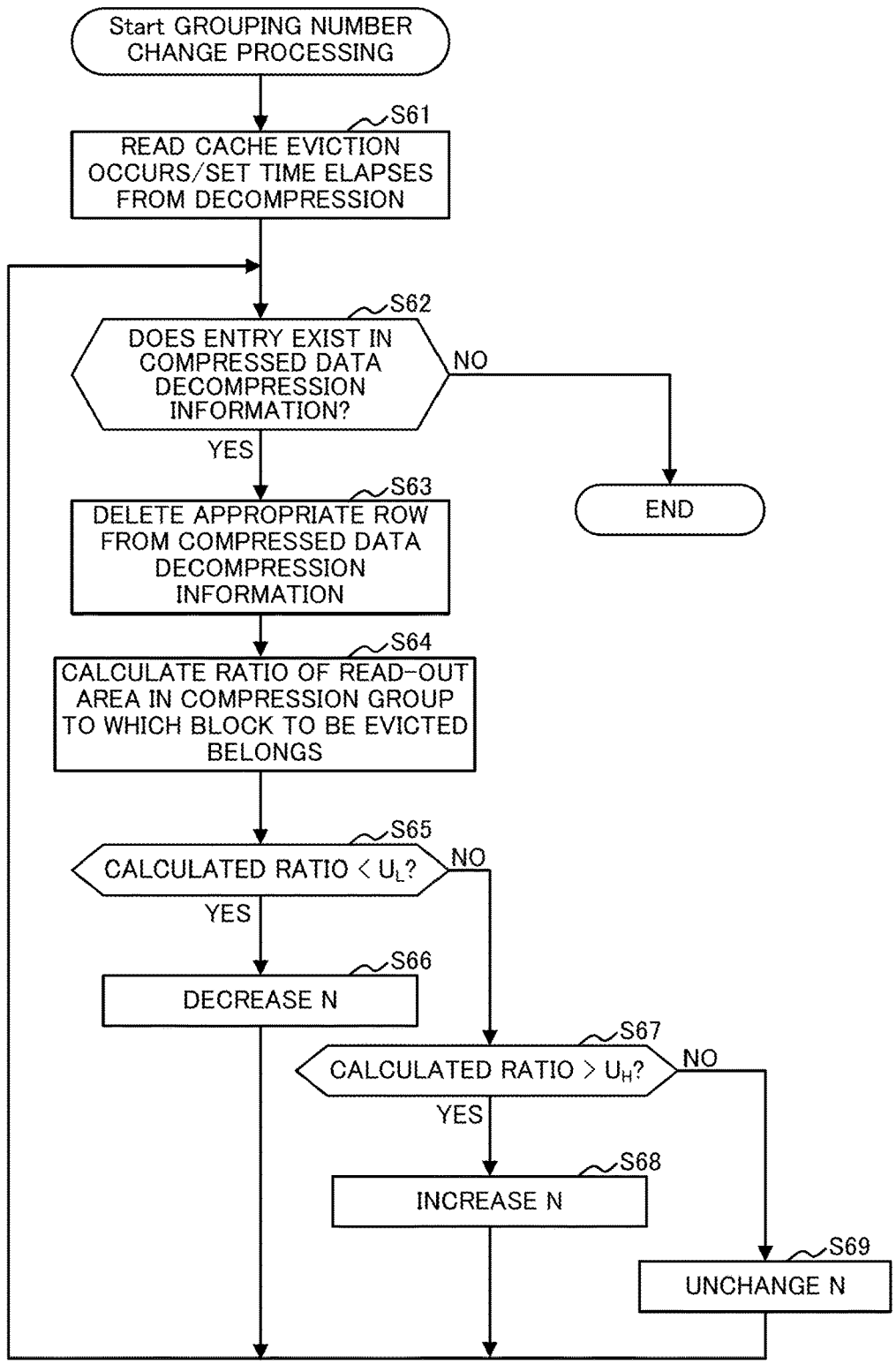
FIG. 15 is a flowchart for describing an example of grouping number change processing.

Next, an operation example of grouping number (upper limit) (N) change processing will be described with reference to FIG. 15.

When eviction of the read cache occurs, or a set time elapses from decompression of the compressed data to the read cache (step S61), the parameter change unit 354 performs processing below. Note that occurrence of the eviction of the read cache or elapse of the set time from decompression of the compressed data to the read cache may be determined by cache control of the controller 35.

The parameter change unit 354 judges whether an entry exists in the compressed data decompression information 316 (step S62).

When the entry exists in the compressed data decompression information 316 (Yes in step S62), the parameter change unit 354 selects one row (entry) from the compressed data decompression information 316, and deletes the row (step S63).

The parameter change unit 354 then calculates a ratio of a read-out area in the compression group to which the block to be evicted belongs (step S64). As an example, the parameter change unit 354 obtains 2 (the number of bits of "1")/5 (the number of all bits)=0.4 (40%), when "01001" is set to the read flag of the compression group of the row deleted in step S63.

The parameter change unit 354 judges whether the calculated ratio is smaller than $(U_L)$ (step S65). When the calculated ratio is smaller than $(U_L)$ (Yes in step S65), the parameter change unit 354 decrease (N) (for example, decreases (N) by "1") (step S66), and the processing is moved to step S62.

Meanwhile, when the calculated ratio is not smaller than $(U_L)$ (No in step S65), the parameter change unit 354 judges whether the calculated ratio is larger than $(U_H)$ (step S67).

When the calculated ratio is larger than $(U_H)$ (Yes in step S67), the parameter change unit 354 increases (N) (for example, increases (N) by "1") (step S68), and the processing is moved to step S62.

When the calculated ratio is not larger than $(U_H)$ (No in step S67), the value of (N) is not changed (step S69), and the processing is moved to step S62.

Further, when no entry exists in the compressed data decompression information 316 in step S62 (No in step S62), that is, when judgment of the (N) change processing is completed for all the compressed data concerning the eviction from the read cache, the processing is terminated.

[2] Others

The above-described technology can be modified or changed, and implemented.

For example, the functional blocks of the CM3 illustrated in FIG. 5 may be merged or divided by arbitrary combinations.

Further, the functions of the CM3 may be realized by a multiprocessor or a multi-core processor 3a.

In one aspect, both improvement of the compression ratio of data and reduction of a decrease in the access performance to compressed data can be achieved.

All examples and conditional language recited provided herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An information processing device comprising:
 a memory configured to store data concerning a write access; and a processor coupled to the memory, the processor being configured to:
record, for each data, time of a write access of the data to management information,
when writing out data from the memory to a storage, determine a plurality of data as a group of overall compression based on the management information, the plurality of data having a difference of time of write accesses being equal to or less than a threshold value, and
compress the plurality of data corresponding to the determined group by an overall compression, and write compressed data obtained through the overall compression to the storage.

2. The information processing device according to claim 1, wherein the processor selects data to be written out from the memory to the storage in order, calculates a difference between time of a write access of the selected data and time of a previous write access of the selected data, and includes, when the calculated difference is equal to or less than the threshold value, the selected data to a group of the overall compression to which data concerning the previous write access belongs.

3. The information processing device according to claim 1, wherein the processor performs control to change the threshold value based on a read-out access to the compressed data stored in the storage.

4. The information processing device according to claim 3, wherein the processor performs control to decrease the threshold value when a read-out access occurs to data in an area other than a head of compressed data stored in the storage.

5. The information processing device according to claim 3, wherein the processor performs control to increase the threshold value when a read-out access occurs to compressed data stored in the storage, the compressed data being compressed single data.

6. The information processing device according to claim 1, wherein the processor performs the determination based on an upper limit of the number of data to be included in the group of the overall compression.

7. The information processing device according to claim 6, wherein the processor
decompresses the compressed data read out from the storage to the memory, and
manages a state of a read-out access to the decompressed data, and changes, when the decompressed data is released from the memory, the upper limit based on the state of the read-out access.

8. The information processing device according to claim 1, wherein,
when receiving a second write access to write second data in a second address, in a state where time of a first write access to write first data in a first address is recorded in the management information, the second data being same as the first data, the processor associates the second address with the first data, and suppresses storing of the second data to the memory, and
the processor excludes the first data from a candidate of data to be included in the group of the overall compression.

9. The information processing device according to claim 1, wherein the processor considers a plurality of data, each of the data belonging to a same volume, as candidates of data to be included in the group of the overall compression.

10. A non-transitory computer-readable recording medium having stored therein an information processing program for causing a computer to execute a process comprising:
recording, for each data, time of a write access of the data to management information,
when writing out data from the memory that stores data concerning a write access to a storage, determining a plurality of data as a group of overall compression based on the management information, the plurality of data having a difference of time of write accesses being equal to or less than a threshold value, and
compressing the plurality of data corresponding to the determined group by an overall compression, and writing compressed data obtained through the overall compression to the storage.

11. The non-transitory computer-readable recording medium according to claim 10, wherein the determining selects data to be written out from the memory to the storage in order, calculates a difference between time of a write access of the selected data and time of a previous write access of the selected data, and includes, when the calculated difference is equal to or less than the threshold value, the selected data to a group of the overall compression to which data concerning the previous write access belongs.

12. The non-transitory computer-readable recording medium according to claim 10, the process further comprising:
performing control to change the threshold value based on a read-out access to the compressed data stored in the storage.

13. The non-transitory computer-readable recording medium according to claim 12, wherein the performing control includes control to decrease the threshold value when a read-out access occurs to data in an area other than a head of compressed data stored in the storage.

14. The non-transitory computer-readable recording medium according to claim 12, wherein the performing control includes control to increase the threshold value when a read-out access occurs to compressed data stored in the storage, the compressed data being compressed single data.

15. The non-transitory computer-readable recording medium according to claim 10, wherein the determining includes performing the determination based on an upper limit of the number of data to be included in the group of the overall compression.

16. The non-transitory computer-readable recording medium according to claim 15, the process further comprising:
decompressing the compressed data read out from the storage to the memory, and
managing a state of a read-out access to the decompressed data, and changing, when the decompressed data is released from the memory, the upper limit based on the state of the read-out access.

17. The non-transitory computer-readable recording medium according to claim 10, the process further comprising:
when receiving a second write access to write second data in a second address, in a state where time of a first write access to write first data in a first address is recorded in the management information, the second data being same as the first data, associating the second address with the first data, and suppressing storing of the second data to the memory, and the determining includes excluding the first data from a candidate of data to be included in the group of the overall compression.

18. The non-transitory computer-readable recording medium according to claim 10, wherein the determining includes considering a plurality of data, each of the data belonging to a same volume, as candidates of data to be included in the group of the overall compression.

19. An information processing method comprising:
recording, by a processor of a computer, for each data, time of a write access of the data to management information,
when writing out data from the memory that stores data concerning a write access to a storage, determining, by the processor, a plurality of data as a group of overall compression based on the management information, the plurality of data having a difference of time of write accesses being equal to or less than a threshold value, and
compressing the plurality of data corresponding to the determined group by an overall compression, and writing compressed data obtained through the overall compression to the storage, by the processor.

20. The information processing method according to claim 19, wherein the determining by the processor selects data to be written out from the memory to the storage in order, calculates a difference between time of a write access of the selected data and time of a previous write access of the selected data, and includes, when the calculated difference is equal to or less than the threshold value, the selected data to a group of the overall compression to which data concerning the previous write access belongs.

\* \* \* \* \*